United States Patent
Costain

(10) Patent No.: US 10,483,904 B2
(45) Date of Patent: Nov. 19, 2019

(54) INTEGRATED SOLAR BUILDING PRODUCT PANELS

(71) Applicant: Roderick Matthew Costain, Ottawa (CA)

(72) Inventor: Roderick Matthew Costain, Ottawa (CA)

( * ) Notice: Subject to any disclaimer, the term of this patent is extended or adjusted under 35 U.S.C. 154(b) by 0 days.

(21) Appl. No.: 15/827,617

(22) Filed: Nov. 30, 2017

(65) Prior Publication Data

US 2018/0159463 A1    Jun. 7, 2018

Related U.S. Application Data

(60) Provisional application No. 62/428,803, filed on Dec. 1, 2016.

(51) Int. Cl.
| | |
|---|---|
| *H02S 20/26* | (2014.01) |
| *H02S 40/36* | (2014.01) |
| *E04D 1/30* | (2006.01) |
| *E04F 13/072* | (2006.01) |
| *H01L 31/048* | (2014.01) |
| *E04D 1/26* | (2006.01) |

(Continued)

(52) U.S. Cl.
CPC .............. *H02S 20/26* (2014.12); *E04D 1/30* (2013.01); *E04F 13/072* (2013.01); *H01L 31/0481* (2013.01); *H02S 40/36* (2014.12); *E04D 1/26* (2013.01); *E04F 13/076* (2013.01); *E04F 13/0871* (2013.01); *E04F 13/0889* (2013.01); *Y02A 30/17* (2018.01); *Y02B 10/10* (2013.01)

(58) Field of Classification Search
CPC ........ H02S 20/26; H02S 40/36; E04F 13/072; E04F 13/076
See application file for complete search history.

(56) References Cited

U.S. PATENT DOCUMENTS

| | | | |
|---|---|---|---|
| 5,590,495 A | 1/1997 | Bressler et al. | 52/173.3 |
| 6,453,629 B1 | 9/2002 | Nakazima et al. | 52/173.3 |

(Continued)

FOREIGN PATENT DOCUMENTS

CN         204206089         3/2015

OTHER PUBLICATIONS

PCT/CA2017/051441 Search Report, dated Feb. 14, 2018.

*Primary Examiner* — Paola Agudelo
(74) *Attorney, Agent, or Firm* — Teitelbaum Bouevitch & McLachlen; Neil Teitelbaum

(57) ABSTRACT

An integrated solar building product panel that may be integrated into an existing structure's building materials providing an esthetically pleasing appearance and structural integrity. The shock absorbing and vibration damping construction panel comprises at least one solar cell assembly supported by a bottom support component with a vibration damping component surrounding each solar cell assembly. A top transparent protective component is mounted on the vibration damping layer with a gap between the solar cell assembly for protecting each solar cell assembly, and transferring any impact forces to the vibration damping layer isolated from the solar cells. Accordingly, in response to a force applied to the top protective component, the top protective component is deformable up to the width of the gap, and the vibration damping component transfers the force to the compressible bottom support component.

16 Claims, 12 Drawing Sheets

(51) Int. Cl.
*E04F 13/076* (2006.01)
*E04F 13/08* (2006.01)

(56) References Cited

U.S. PATENT DOCUMENTS

| | | | |
|---|---|---|---|
| 8,621,813 B2 | 1/2014 | Dube | 52/518 |
| 8,782,972 B2 | 7/2014 | Grieco | 52/173.3 |
| 9,673,344 B2* | 6/2017 | Davey | H01L 31/048 |
| 2009/0178350 A1* | 7/2009 | Kalkanoglu | E04F 13/0864 52/173.3 |
| 2010/0065107 A1 | 3/2010 | Nightingale et al. | 136/251 |
| 2010/0101561 A1 | 4/2010 | Frank et al. | 126/622 |
| 2010/0325976 A1 | 12/2010 | Degenfelder et al. | 52/173.3 |
| 2011/0155221 A1* | 6/2011 | Yu | H01L 31/0488 136/251 |
| 2012/0055550 A1* | 3/2012 | Buller | H01L 31/048 136/259 |
| 2013/0008483 A1* | 1/2013 | Chaney | B32B 37/06 136/245 |
| 2013/0014821 A1* | 1/2013 | Cheng | H01L 31/048 136/259 |
| 2013/0133724 A1 | 5/2013 | Bae et al. | |
| 2014/0102537 A1* | 4/2014 | Malik, Jr. | H01L 31/048 136/259 |
| 2015/0020870 A1* | 1/2015 | Agatsuma | H01L 31/02008 136/251 |
| 2015/0155822 A1* | 6/2015 | Feng | H01L 31/03926 136/259 |
| 2015/0214410 A1* | 7/2015 | Saita | H01L 31/048 136/246 |
| 2015/0287856 A1* | 10/2015 | Kauffman | H01L 31/049 136/251 |
| 2015/0340990 A1 | 11/2015 | Kim et al. | H02S 40/36 |
| 2016/0336467 A1* | 11/2016 | Janet | H01L 31/02168 |

\* cited by examiner

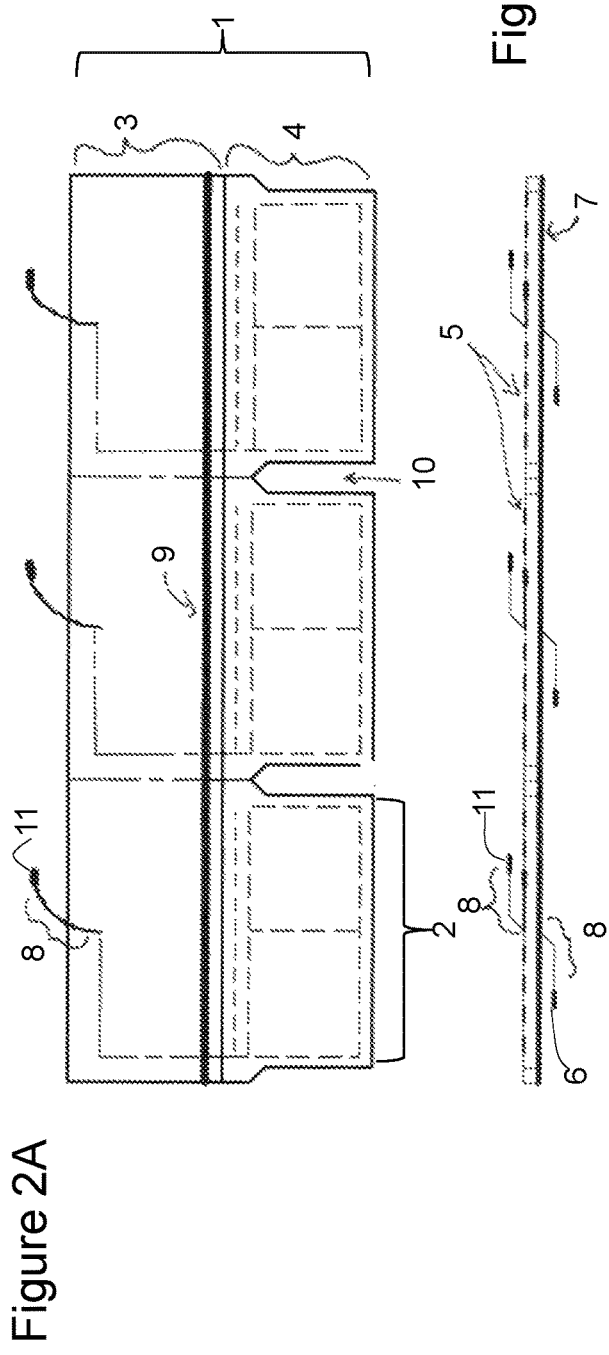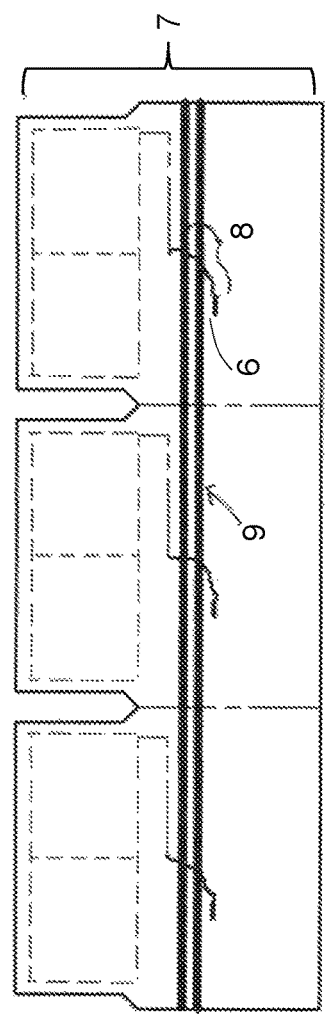

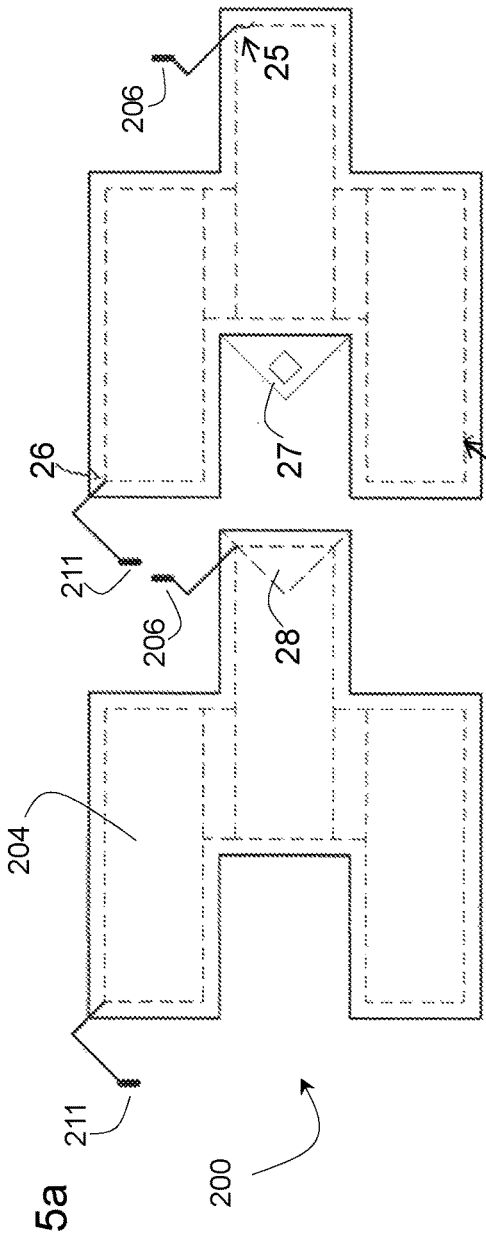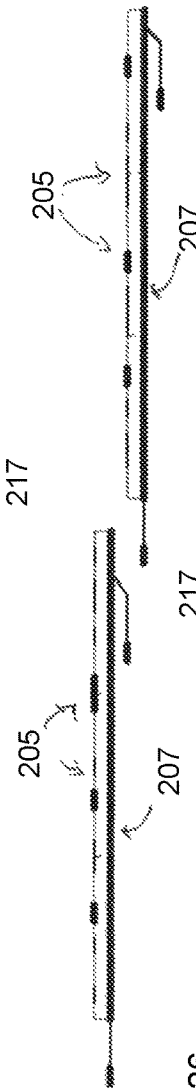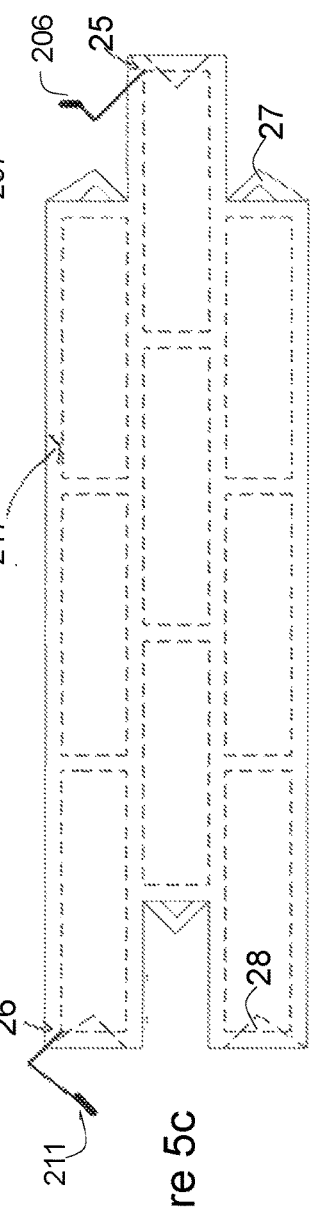
Figure 5a
Figure 5b
Figure 5c

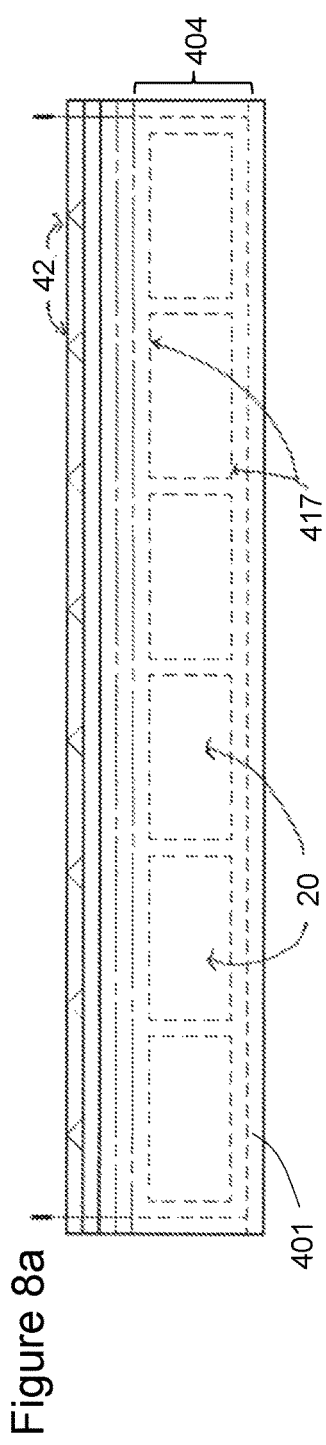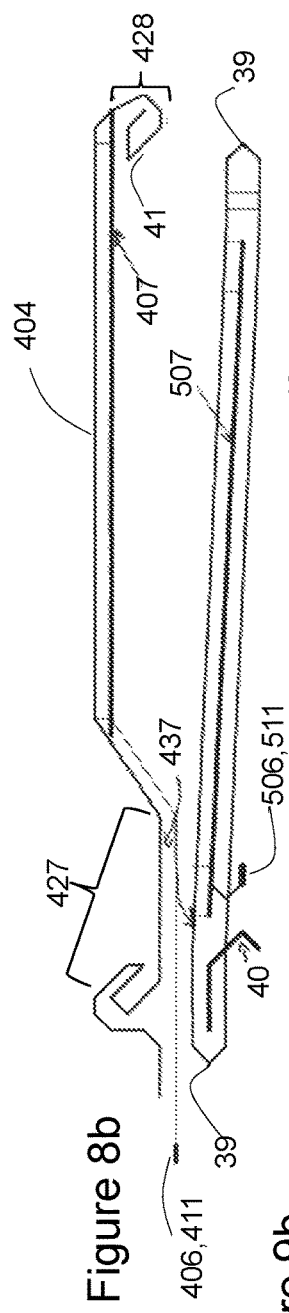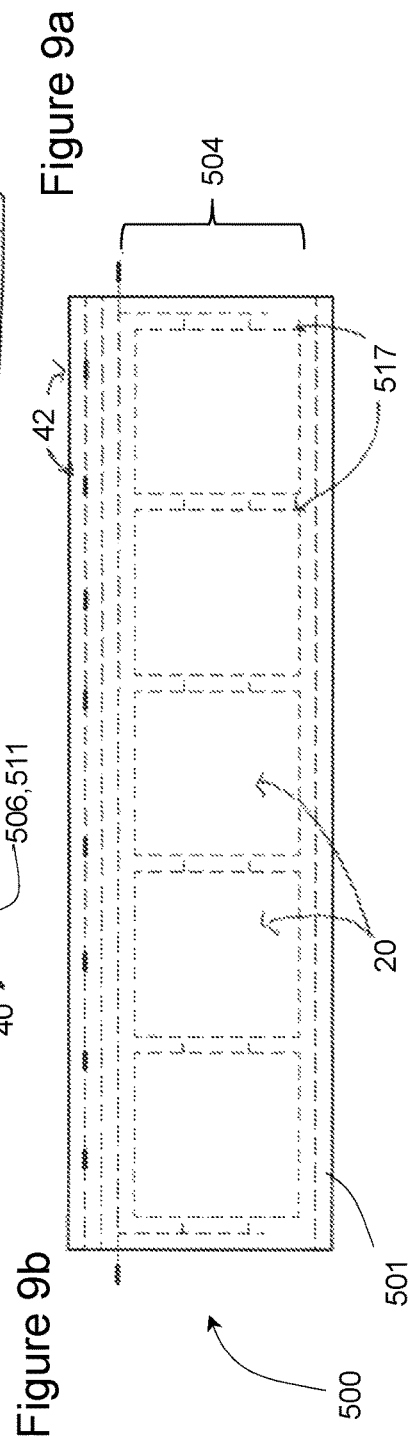

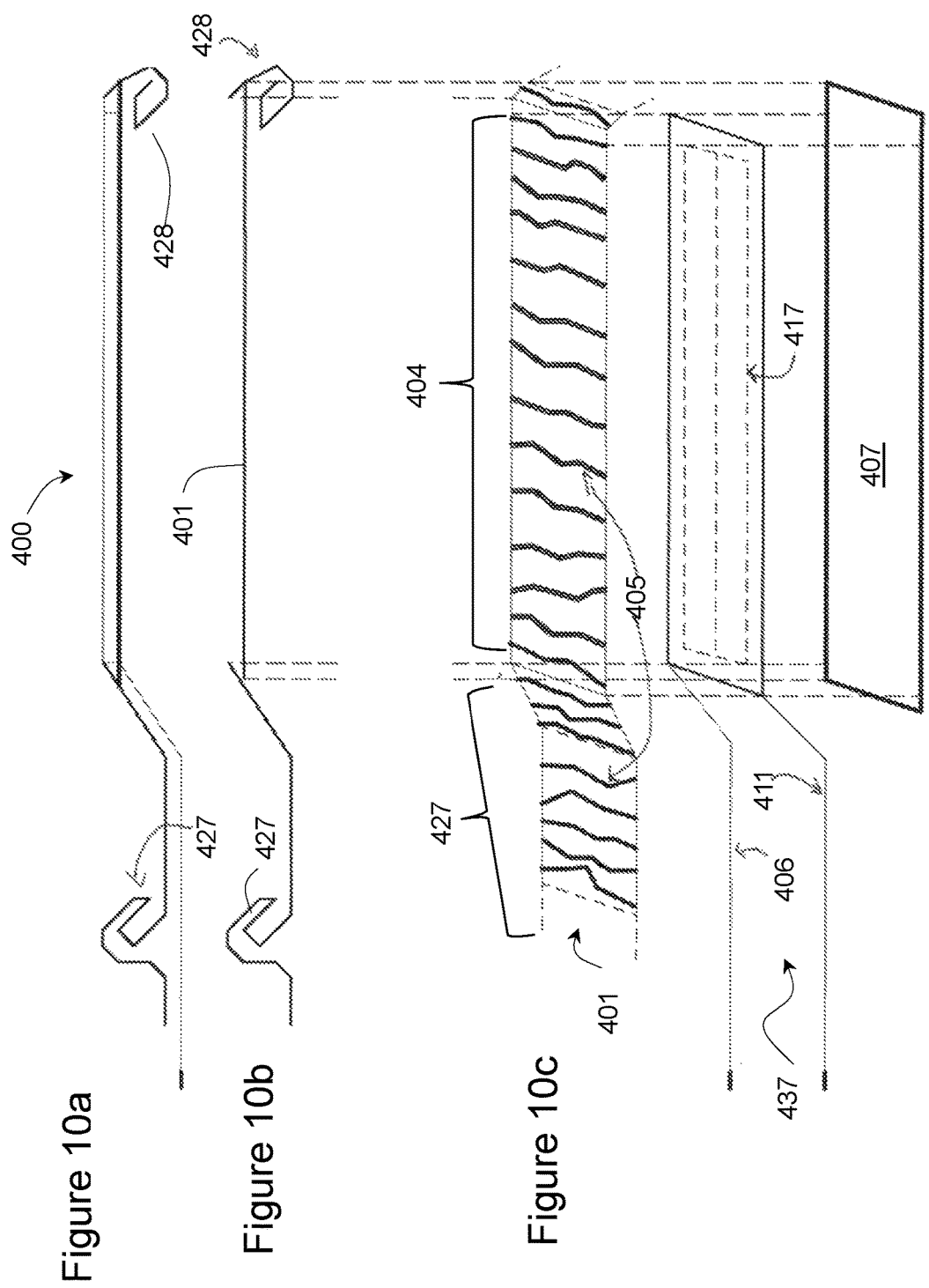

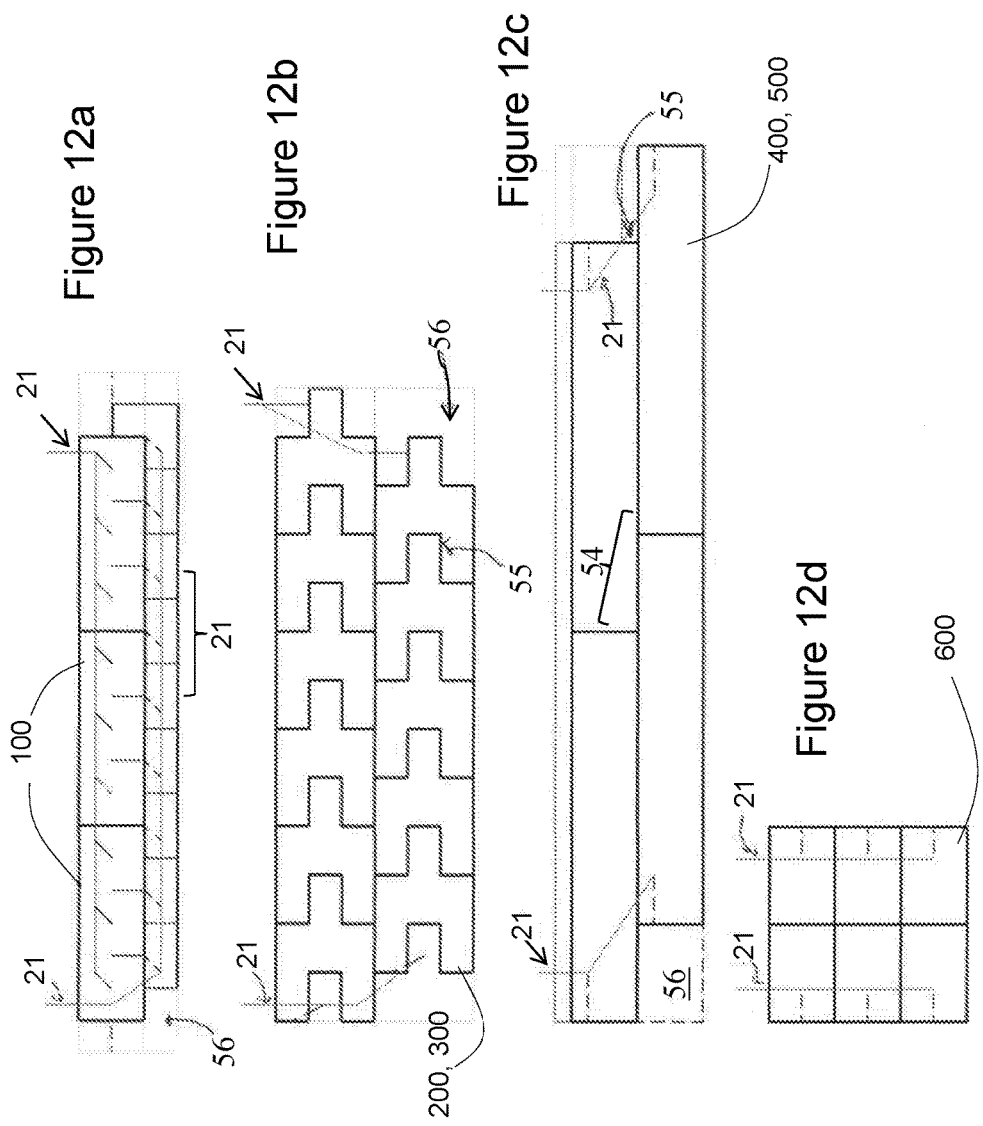

INTEGRATED SOLAR BUILDING PRODUCT PANELS

CROSS REFERENCE TO RELATED APPLICATIONS

This application claims priority from U.S. Patent Application No. 62/428,803, filed Dec. 1, 2016, which is incorporated herein by reference.

TECHNICAL FIELD

The present invention relates to the integration of an assembled solar array component with or within materials that result in solar panels that may replace building products, in particular outer surfacing materials, such as shingles, bricks and siding.

BACKGROUND

Conventional solar panels, when mounted on a home or building, provide an esthetically unpleasing appearance, in contrast to the original architecture of the structure. Moreover, conventional solar panels are constructed of heavy plastic and metal framing to protect the fragile and brittle photovoltaic materials that are subject to breakage during storms or other unforeseen impacts.

An object of the present invention is to overcome the shortcomings of the prior art by providing an integrated solar building product panel that may be integrated into the existing structure's building materials providing an esthetically pleasing appearance and a more rugged design that maintains structural integrity.

SUMMARY OF THE INVENTION

Accordingly, the present invention relates to a shock absorbing and vibration damping construction panel comprising: a bottom support component; at least one solar cell assembly supported by the bottom support component; a vibration damping component surrounding each solar cell assembly; a top transparent protective component mounted on the vibration damping layer with a gap from each solar cell assembly for protecting each solar cell assembly, and transferring any impact forces to the vibration damping layer isolated from the solar cells; and electrodes for electrically connecting each solar cells to adjacent panels.

In response to a force applied to the top protective component, the top protective component is deformable up to the width of the gap, and the vibration damping component transfers the force to the compressible bottom support component.

BRIEF DESCRIPTION OF THE DRAWINGS

The invention will be described in greater detail with reference to the accompanying drawings which represent preferred embodiments thereof, wherein:

FIG. 2A is a top view of the structure of FIG. 1;
FIG. 2B is a side view of the structure of FIG. 1;
FIG. 2C is a bottom view of the structure of FIG. 1.

FIG. 5a is a top view of another embodiment of the present invention;
FIG. 5b is a side view of the structure of FIG. 5a;
FIG. 5c is a top view of another embodiment of the present invention;
FIG. 8a is a top view of another embodiment of the present invention;
FIG. 8b is a side view of the structure of FIG. 8a;
FIG. 9a is a top view of another embodiment of the present invention;
FIG. 9b is a side view of the structure of FIG. 9a;
FIG. 10a is a side view of the structure of FIG. 8a;
FIG. 10b is a side view of the top protective component of the structure of FIG. 8a;
FIG. 10c is an expanded view of the structure of FIG. 10a;
FIG. 11b is a side view of the structure of FIG. 11a;
FIG. 12a illustrate the structures of FIGS. 1 to 4 in an overlapping grid arrangement;
FIG. 12b illustrate the structures of FIGS. 5 to 7 in an interlocking grid arrangement;
FIG. 12c illustrate the structures of FIGS. 8 to 10 in an overlapping or interlocking grid arrangement;
FIG. 12d illustrate the structures of FIG. 11 in an interlocking grid arrangement.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
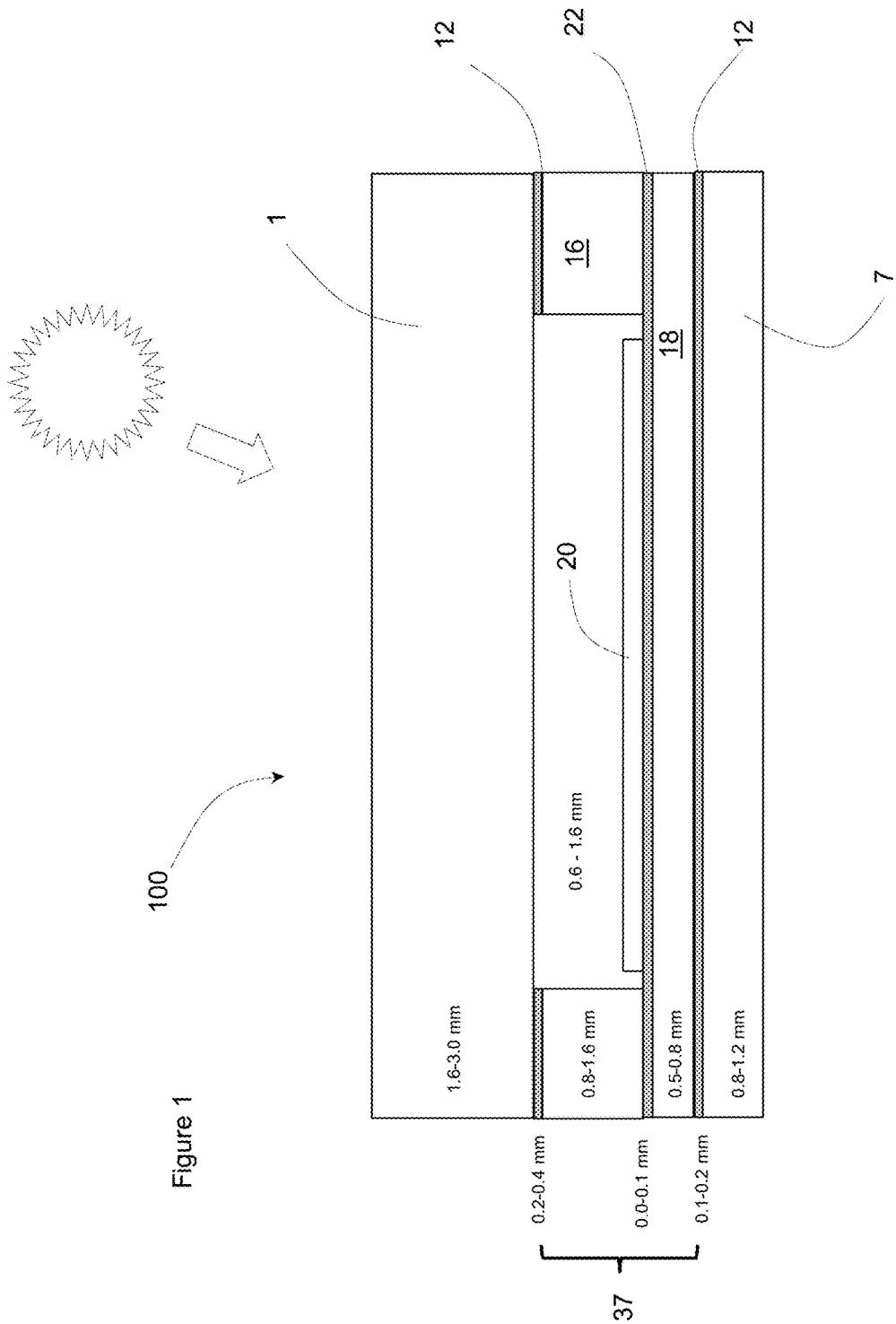
FIG. 1 is a cross-sectional view of an integrated solar panel building structure in accordance with an embodiment of the present invention.

With reference to FIG. 1, in general, an integrated solar panel building structure (ISPBS) 100 of an embodiment of the present invention is comprised of components that enable transmission of electromagnetic radiation to an assembled solar cell array component 20 through a top protective component 1 that is bound to a middle solar array structure 37 and to a bottom support component 7 for the generation of electricity. Adhesive layers 12 are provided between the top protective component 1 and the middle solar array structure 37, and between the middle solar array structure 10 and the bottom support component 7. The solar cells 20 may also be adhered onto a support layer 18 with an adhesive layer 22. One or more vibration dampening/shock absorbing layers 16 may be provided to surround and protect the solar cell array component 20. With reference to FIG. 2A, the various embodiments of the invention may be comprised of components configured into a variety of designs, each configured with a positive (+ve) and negative (−ve) lead 11 and 6, respectively, to enable interconnection of the integrated solar panel building structure 100, as per FIG. 1, in a manner that may cover an entire surface yet may also be combined with traditional building materials to cover a surface of varied dimensions.

With reference to FIG. 1, a ISPBS 100 may be comprised of materials with a thickness of approximately 3/16th of an inch or ranging from 4 to 10 mm, preferably 4 to 7 mm, such that the ISPBS 100 may be installed parallel to the surface of a structure, e.g. house or building. The ISPBS 100 may be comprised of materials that may vary the overall thickness as may be desired for the application. The top protective component 1 may vary in thickness, preferably 1.6 to 3.0 mm, the middle solar array structure 37 may vary in thickness, preferably 1.3 to 2.0 mm; and the bottom support component 7 may vary in thickness, preferably 0.8 to 1.2 mm.

Similarly, the adhesive layers 12 and 22 may vary in thickness, preferably 0.0 to 0.4 mm resulting in an overall thickness of an ISPBS 100 preferably 4.0 to 7.0 mm. The device is illustrated in the context of an incorporated design as per FIG. 1. Some of the adhesive layers 12 and 22 may not increase the overall thickness due to the fact that they are impregnated into the layers 7, 16 and 18 on either side thereof.

The top protective component 1 may be comprised of a surface protective material, and may include three tabs 2 that may be separated to appear like a shingle as in FIG. 2A. The top protective component 1 may include a rear overlap portion 3, which may be comprised of a pressed fiber, commonly known as felt or needled felt, and a transparent portion 4 that is adhered together where the materials 3 and 4 meet. The pressed fiber overlap portion 3 may be comprised, or be impregnated with, oil based additives that add waterproofing characteristics to the layer 3. Ideally, the pressed fiber or felt material has a tensile strength of at least 1.4 MPa (200 psi), preferably between 1.4 MPa and 3.5 MPa (200 psi and 500 psi), and a Young's Modulus of less than 10 GPa, preferably less than 5 GPa, more preferably between 2.4 GPa and 3.5 GPa. Accordingly, the felt material provides the desired strength with much more resiliency and flexibility than other common solar-panel building materials, such as concrete or metal, e.g. steel or aluminum.

An example of a suitable pressed fiber material is ASTM D2626, "Standard Specification for Asphalt-Saturated and Coated Organic Felt Base Sheet Used in Roofing," applies to cellulose fiber-based (organic) asphalt saturated and coated felts with mineral surfacing on the top side intended for use as the first ply of a built-up roof system. The standard provides physical property requirements and dimensional tolerances for materials with and without perforations. Non-perforated material defined in the standard can perform as a vapor retarder in roof systems when adhered in a solid mopping of roofing asphalt.

The material making up the transparent portion 4 may be comprised of plexiglass, lexan, polycarbonate, nylon or any similar transparent material. The transparent material may be comprised of additives within or on the surface of the transparent portion 4 to result in translucent, opaque or colored variation, as may compliment a particular patterned design 5, such as a rough shingle design.

With reference to FIGS. 2A, 2B and 2C, the positive lead 11 and the negative lead 6 may be comprised of an insulated wire with male and female connectors and an inline diode. The positive lead 6 may extend from beneath the bottom supporting component 7 for each separable tab 2 with a length 8 to enable electrical interconnection to adjacent leads 11 on adjacent ISPBS 100, when the ISPBS are overlapped, e.g. when transparent portion 4 of one ISPBS 100 overlaps the rear overlap portion 3 of an overlapping adjacent ISPBS 100, like shingles.

Figure 3:
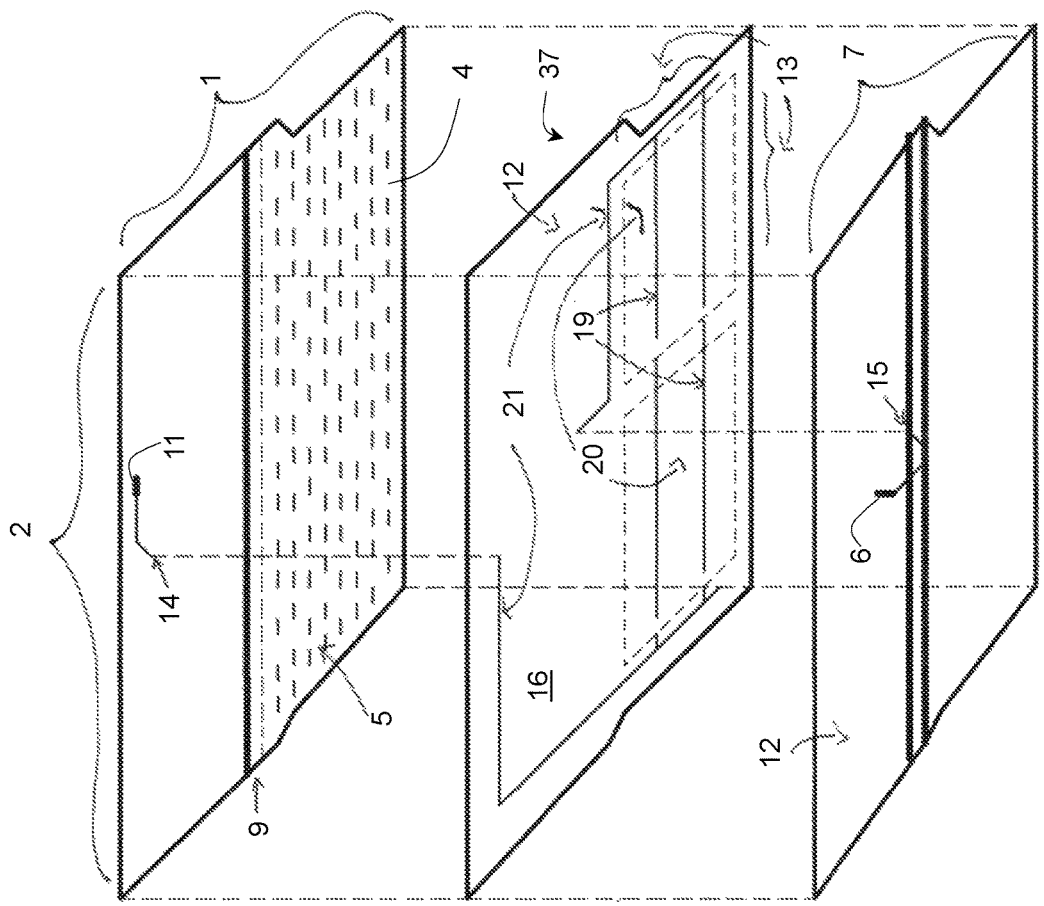
FIG. 3 is an expanded view of the structure of FIG. 1.

The bottom supporting component 7 may be comprised of a woven fabric material, e.g. foam or felt or needled felt. The middle solar array structure 37 (dotted lines), may be adhered in between the surface protective component 1 and the bottom supporting component 7. Each tab 2 may be separated from the ISPBS 100 along a separating line extending from a gap 10 between the tabs 2. As each tab 2 may be comprised of its own interconnection leads 6 and 11, separation of a tab 2 from the ISPBS 100 does not harm the removed tab 2 or the ISPBS 100. The surface protective component 1 and the bottom supporting component 7 may include adhesive strips 9 positioned to enable the adherence of adjacent, e.g. overlapping, ISPBS 100. The adhesive strips 9 may enable electrical isolation of the connection of the leads 6 and 11, from the environment, when the ISPBS 100 are placed upon one another in an offset manner. The adhesive strips 9 may also bind to adjacent ISPBS 100 to form an interconnected and grid with each ISPBS 100 both obtaining and providing structural support to those adhered to each other With reference to FIG. 3, the ISPBS 100 is comprised of the top protective component layer 1, the middle solar array structure layer 37, and a bottom support component layer 7 that combine to produce a shock absorbing and vibration damping device that protects the solar cells 20 from damage. FIG. 3 illustrates one tab 2 of the ISPBS 100 as incorporated into a design, as illustrated in FIG. 1, in an expanded view to further describe the components. The top protective component layer 1 illustrates the surface protective material, as hereinbefore described. The patterned design 5 may be comprised of additional color contrast or textured materials applied to the surface of the transparent portion 4 to compliment the design, e.g. visual colored and textured appearance of a conventional shingle. The patterned design 5 may be visible on the transparent portion 4 when viewed from the top yet more so when at an angle. The top protective component 1 may also include the positive lead 11 (or negative lead 6) that extends out of the surface through an opening 14.

The upper surface of the vibration dampening/shock-absorbing component layer 16 of the middle solar array component 37 may be coated with of the adhesive 12 applied in a manner so as to outline one or more cut-out shapes 13 that may align to the shapes of solar cell 20. The middle solar array component 37 may also include interconnection wires 19, individual solar cells 20 and bus wires 21 forming a solar array that is bound between the vibration dampening/shock-absorbing component layer 16 and the bottom support component layer 18. The middle solar array component 37, as an assembled sub-component, is further described by FIG. 4.

The bottom support component 7, may include the adhesive 12 applied to the surface thereof and/or impregnated therein. The adhesive 12 applied to the middle solar array component 37 and the bottom support component 7 binds the three components 1, 37 and 7 together, and permeates into the surface of the pressed or woven fiber layers, when assembled into a single ISPBS device 100 in a manner that both binds to and seals and insulates the middle solar array component 37 within the assembly. The bottom support component 7 may have a thickness of between 0.8 and 2 mm, preferably between 0.8 and 1.2 mm. The positive lead 6 (or negative lead 11) may extend below the bottom support layer 7 through an opening 15 that enables interconnection with the negative lead 11 (or positive lead 6) that may extend above the top protective component layer 1 at opening 14 of a second overlapping ISPBS 100. Multiple ISPBS devices 100 may be interconnected in an overlapping manner to form a larger protective surface grid.

Figure 4:
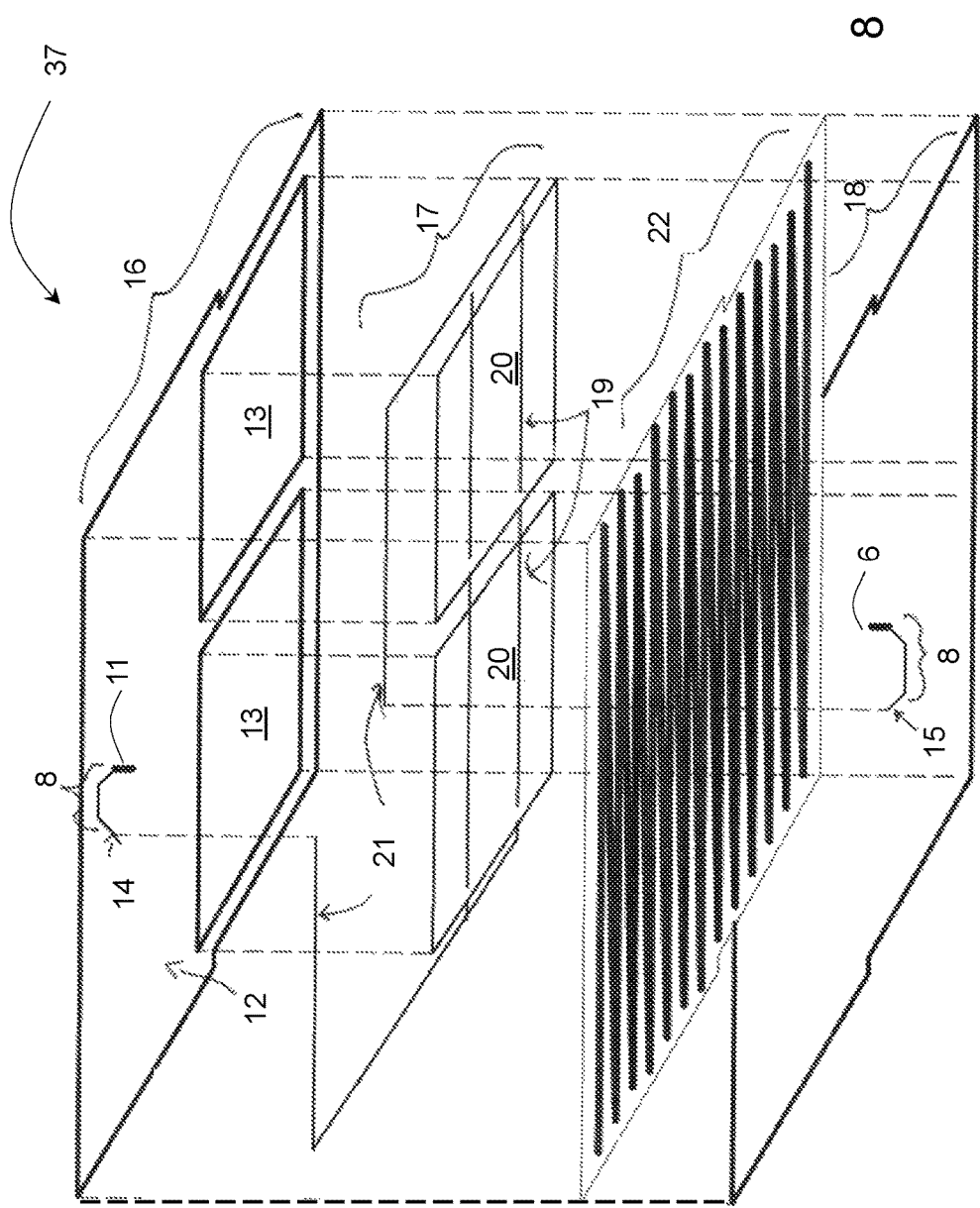
FIG. 4 is an expanded view of the solar array component of the structure of FIG. 1.

With reference to FIG. 4, the middle solar array component 37, may be comprised of multiple layers forming an assembled component, including the formed vibration dampening or shock-absorbing component layer 16, typically co-planar with the solar array component layer 20, and the support layer 18 that may encloses the solar array electrical wires 19 and 21. The vibration dampening/shock-absorbing component layers 16 and 18 may be comprised of the same pressed fiber material as described above cut or formed into a shape that aligns to the shape of the device. The vibration dampening/shock-absorbing component layer 16 may include openings or cut outs 13 removed to align to the shape of the solar cells 20, as configured in the array. The middle solar array component 37 may also include the adhesive 12 applied to the top surface of the vibration dampening/shock-absorbing component layer 16 to outline the solar cells 20 when adhered to the top protective component 1.

In a solar array configuration 17 in the illustrated embodiments, the solar cells 20 may be comprised of one or more solar cells 20 of any dimension, preferably 125 mm by 125 mm, that may be interconnected by strips of flat copper (nickel coated) wires 19 that are soldered or glued, e.g. with conductive glue, across the width of the solar cell 20 from the top of the first solar cell 20, e.g. negative side of solar cell, interconnected to the bottom of the next solar cell 20, e.g. positive side of solar cell. The flat copper wires 19 are aligned and soldered (or glued) to the silver, e.g. negative side, or silica, e.g. positive side, connection strips spanning the width of the solar cell 20. The interconnection wires 19 are soldered (or glued) to outer bus wires 21 and the lead wires 6 and 11, forming the solar array configuration 17. The configuration 17 results in the solar cells 20 connected in series. The outer bus wires 21 may be positioned to align to the openings 14 and 15 to connect to the positive 11 and negative 6 leads that are convenient for interconnection. The lead wires 11 may extend through the formed shock-absorbing component layer 16 and the support layer 18 through the openings 14 and 15, respectively, to align to the same positions extending through the top protective component 1 and the bottom supporting material 7, as described in FIG. 3. The lead wires 6 and 11 may be comprised of a wire of sufficient length 8 to connect with an inline diode. The support layer 18 may be comprised of the same pressed fiber material, described above.

The support layer 18 may include the adhesive coating 22, which may be comprised of a mixture of rubberized and urethane fibers and petroleum distillate and/or oil additives, which are semi-polymerized with epoxy based resins. The adhesive coating 22 may be applied to the upper surface of the support layer 18 in a quantity such that it provides a backing adhesive layer to the solar cells 20 yet embeds the bus 21 and interconnection wires 19 between the solar cells 20 of the solar array 17. When the solar array 17 is placed on the surface of the support layer 18 and the formed vibration dampening/shock-absorbing component layer 16 is fitted on top so as to outline the solar cells 20 and rolled together, the semi-polymerized adhesive 22 partially flattens out so to electrically insulate and seal the interconnection wires 19 and the bus wires 21, while enabling the top of the solar cells 20 to remain free of the adhesive 22 for exposure to sunlight. This results in the assembled middle solar array component 37, as referenced in FIG. 3.

During an impact, e.g. hail or falling branches, on the top protective component layer 1, the transparent portion 4 may slightly deflect into the gap between the transparent portion 4 and the solar cell 20, without contacting the solar cell 20, to absorb and isolate the shock from the solar cell 20. The force of impact will be transferred from the transparent portion 4 to the vibration dampening/shock-absorbing layer 16 surrounding the solar cells 20, as the top protective layer 1 elastically rebounds, and then ideally to the support layer 18 and to the bottom support component 7. The vibration dampening/shock absorbing layer 16, and ideally the support layer 18 combine to further absorb the shock and dampen vibrations that occur while the protective layer 1 elastically rebounds and transfer these shocks and vibrations to the bottom support component 7. The bottom support component 7 provides suitable strength, but also a more elastic deformation to absorb shock and vibration forces. The device materials surrounding the solar cell 20 combine to allow elastic deformation that protects the solar cell 20, e.g. a Young's Modulus of between 3 and 5 GPa, as compared to common construction material, such as steel, concrete or wood, ensuring that the solar cells 20 are insulated from damage due to impacts.

The middle layers 16 and 18 may be comprised of bituminous felts. The felt properties add the vibration absorption and mechanical properties, and the bitumen makes it waterproof. There are other waterproofing additives that could be used. Their commercial standard grades may be in the range of 12R3X, 9R1, 9R2 or 9R3 (SAE F55, 10, 11 or 12), which include the desired physical/mechanical properties. They are not so dense that they cannot be impregnated with bitumen to make them waterproof, and they add a level of stiffness. When glued together they may be even stiffer. These materials may be found in various thicknesses.

The main difference between the middle layers 16 and 18 and the bottom supporting component 7 is that the bottom supporting component 7 may not impregnated with anything, the felt specifications may be the same as previously mentioned, e.g. one could use a woven fiber material or a foam.

With reference to FIGS. 5A to 5C, an alternative ISPBS 200 may be comprised of materials that are similar to those previously described yet result in a different configuration. Similarly, the ISPBS 200 may be comprised of materials that may vary the overall thickness of the device, as may be desired by the application, and allow the device to be installed parallel to the surface of a structure. The top view (FIG. 5A) and alternate configuration view (FIG. 5C) illustrate that a top protective component 201 may be comprised entirely or mostly, e.g. >80%, of a transparent portion 204 similar in composition to the transparent portion 4 as described above, yet varied in size and shape, such that an offset or Y-shape The offset shape may be interconnected in an interlocking manner (FIG. 11) to form a grid pattern and into larger surface cover, e.g. siding.

The transparent portion 204 may be comprised additional materials adhered to the surface so as to produce a patterned design 205 that is visible when viewed from the top or front. The edge view (FIG. 5B) illustrates the patterned design 205 adhered to the surface of the transparent portion 204, and may be comprised of similar materials as referenced herein. The edge view (FIG. 5B) illustrates the bottom supporting component 207 and the positive and negative leads 206 and 211, respectively, which may extend from the bottom near the sides of the ISPBS 200 at openings 25 and 26, respectively, appropriate for interconnection. The bottom support component 207 may be comprised of a similar material as in FIGS. 1 to 4, and may include one or more mounting connectors 27, and corresponding recessed mounting connector 28, suitable for interconnection of interlocking adjacent ISPBS 200. The ISPBS 200 may include a solar array 217, as illustrated by the dotted lines, that is embedded within an assembled solar array component 237 that may be comprised of materials as described hereinbefore, yet may be arranged in a different configuration as further described by FIG. 6. This middle solar array component 37, may be embedded between the top protective component 201 and the bottom support component 207, in a manner similar as in the description of FIGS. 1 to 4.

Figure 6:
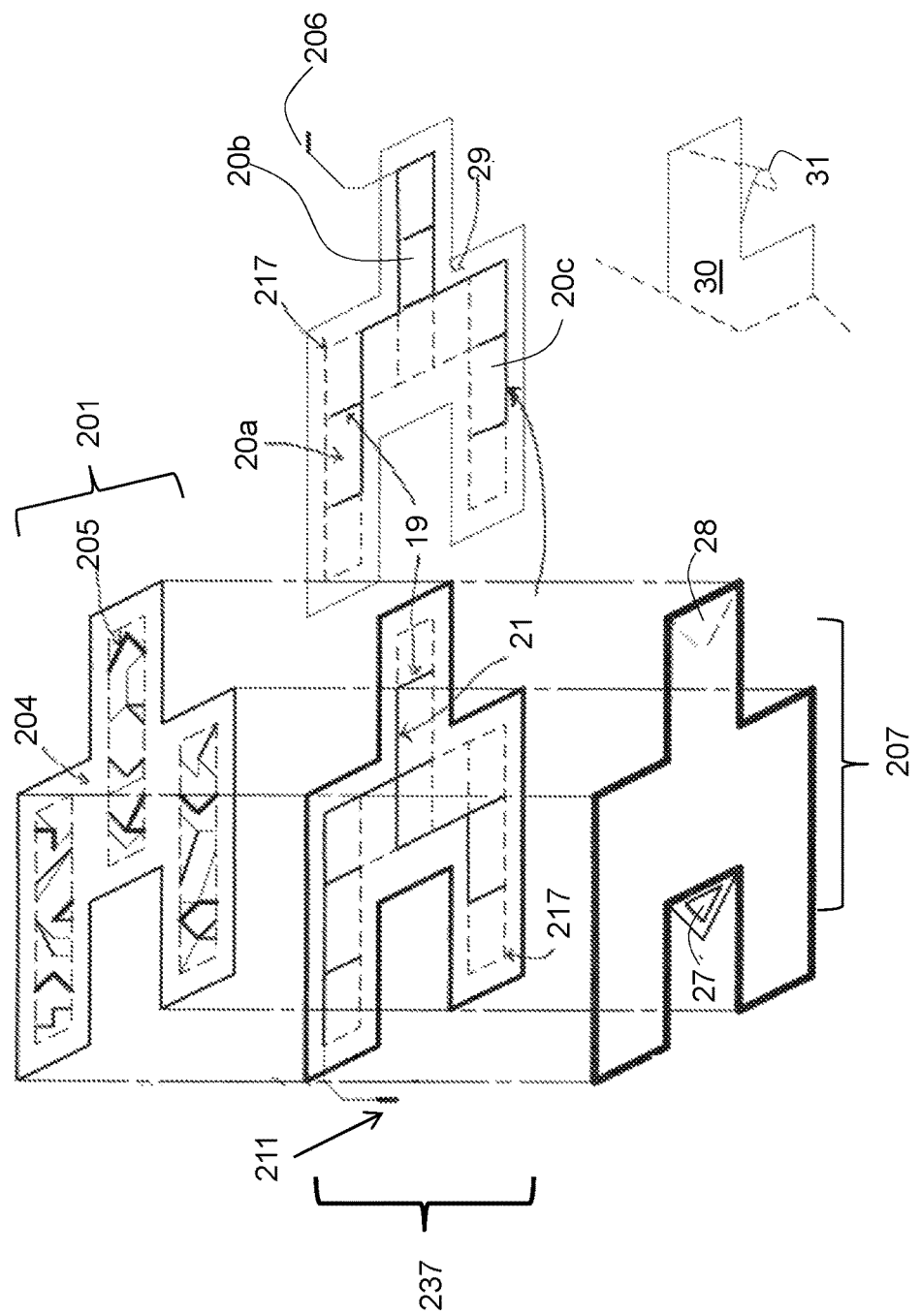
FIG. 6 is an expanded view of the structure of FIGS. 5a and 5b.

With reference to FIG. 6, the ISPBS 200 may be comprised of a top protective component 201 a middle solar array shock-absorbing component 237 and a bottom support component 207, which may be comprised of similar materials as bottom support component 7. The top protective component 201 may be comprised of the same transparent material as transparent portion 4. The transparent material may be comprised of additional colored or textured materials applied to the surface so as to produce the patterned design 205, e.g. brick or siding, as may be visible when viewed from the front. The middle solar array component 237 may be comprised of similar materials as solar array component 37, yet be configured vertically with the solar cell 20b in the middle offset by top and bottom solar cells 20a and 20c by one half width. The components within the solar array 217 may be comprised of similar materials as described hereinbefore with reference to solar array 17. The solar cells 20a-20c, the interconnection wires 19 and the bus wires 21 may be configured into an offset design so as to compliment the design. The solar cells 20a-20c may be comprised of a different size and shape, e.g. 70 mm by 125 mm, as illustrated by the dotted lines in FIG. 6. The solar cells 20a-20c may be connected to the solar array 217 and the positive and negative leads 211 and 206, respectively, by the bus wires 21 and the solar cell interconnection wires 19, as herein before discussed. The solar cells 20a-20c in this configuration result in parallel connections within the solar array 217, although series is possible. The bottom support component 207 may be comprised of a similar material as bottom support component 7, yet is formed into the shape to compliment the top protective component 201, and including a mounting connector 27 with a corresponding recessed mounting connector 28. The bottom support component 207 may be additionally comprised of a surface mounting adhesive 30 with a removable plastic sheet 31 to allow attachment to surfaces that may be oriented vertically.

Figure 7:
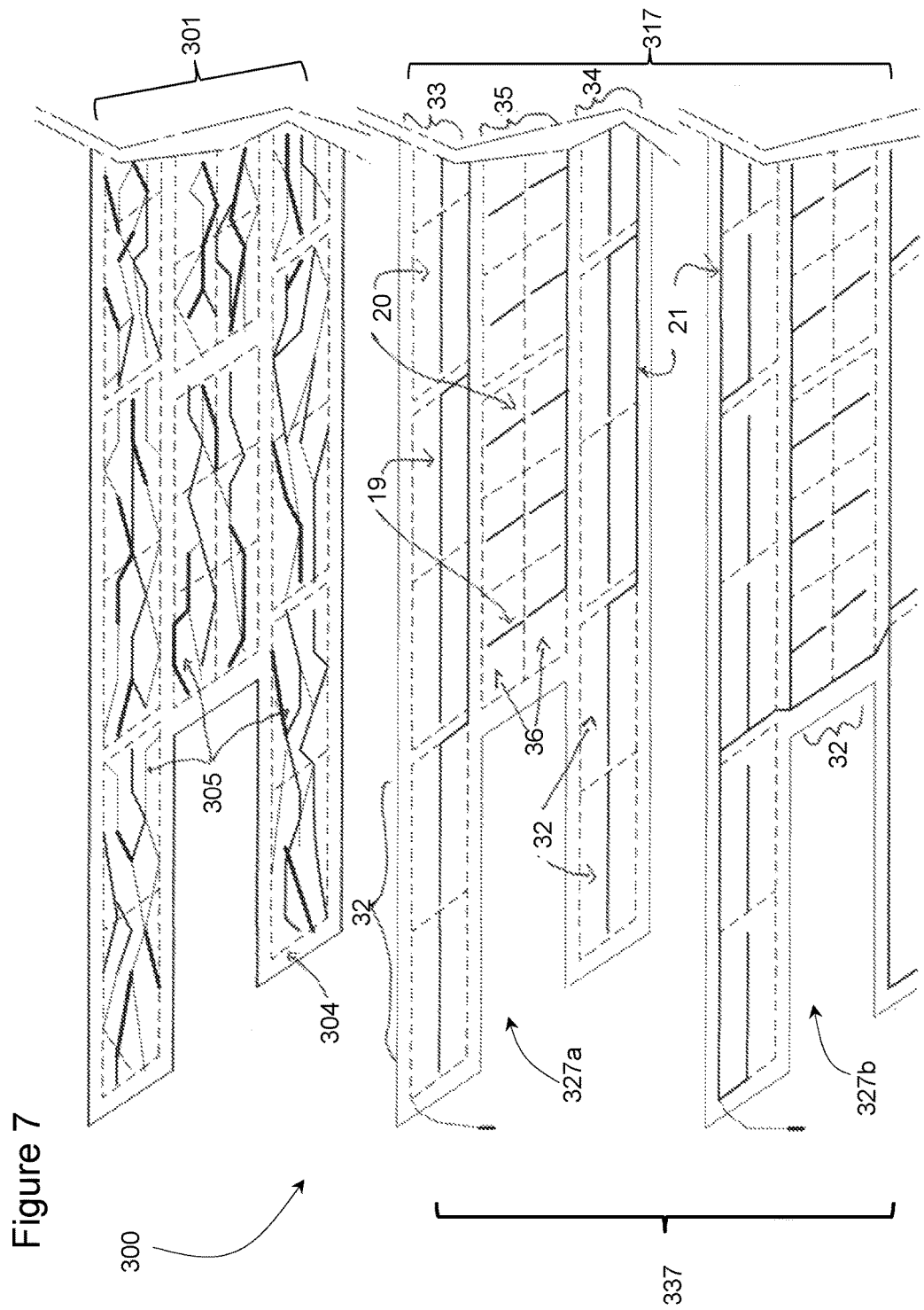
FIG. 7 is an expanded view of the structure of FIG. 5c.

With reference to FIG. 7, a ISPBS 300 may be comprised of materials as described in FIGS. 1 to 6, yet configured with additional adjacent solar cells 20 so as to result in a larger solar array 317 as illustrated by the dotted lines. The embodiment includes a top protective component 301 and two layers of the middle solar array component 337. The ISPBS may be comprised of similar materials the ISPBS 100 and 200, and include a bottom support component that is not illustrated. The top protective component 301 may be comprised entirely, e.g. >80%, of a transparent portion 304 that includes a patterned design 305, with properties that compliments the configuration of the middle solar array component 337. The middle solar array component 337 may be comprised of similar materials as solar array component 37 and 237, yet the solar array component 337 may vary by the number of solar cells 20 and the configuration, e.g. as illustrated by the dotted lines. The positive portion 327a and the negative portion 327b of the solar array 317 are illustrated separately. In this case a top row 33 and a bottom row 34 of the solar array 317 may be comprised of larger rectangular, e.g. 60 mm by 125 mm, solar cells 20 arranged end to end horizontally in sets of two. A middle row 35 may be comprised of smaller, e.g. less than half the area, rectangular, e.g. 40 mm by 70 mm, solar cells 20 arranged into repeating sets of 3 by 2 configurations arranged vertically 36. Each pair of cells 32 may then be interconnected in series and then connected to bus wires 21 in parallel to form the solar array 317.

With reference to FIGS. 8a, 8b, 9a and 9b, a ISPBS 400 (FIGS. 8a and 8b), as referenced in the exploded view FIGS. 10a-10c, and ISPBS 500 (FIGS. 9a and 9b) may be comprised of materials that are similar to those previously described yet may also be comprised of alternate materials so as to expand the device applications. The ISPBS 400 and 500 share properties with ISBPS 100, 200 and 300, as they may be comprised of similar materials as previously described. The ISPBS 400 includes a top protective component 401 with a transparent portion 404 component with a solar array 417, dotted lines, within the embedded middle solar array component 437, yet the configuration may be comprised of solar cells 20 that vary in size, e.g. 60 mm by 125 mm or 125 mm by 125 mm. In the ISPBS 400 embodiment, the bottom supporting component 407 includes additional interlocking mounting support connectors 427 and 428. The mounting connectors 427 and 428 may be comprised of a vinyl, pressed wood or particle board material or some other resilient material enabling a snap fit therebetween. As with previous designs a positive lead 411 and a negative lead 406 extend from the solar array 417 to enable interconnection of the ISPBS 400 when overlapped and interlocked to form a grid or larger surface covering.

The ISPBS 500 may also include a metal or plastic shaped tab 40 for receiving an end 39 of an adjacent ISPBS 500. The ends 39 may have mounting holes 42 to enable fastening of the ISPBS 500 to a surface. As with previous designs a positive lead 511 and a negative lead 506 extend from the solar array 517 to enable interconnection of the ISPBS 500 when overlapped and interlocked to form a grid or larger surface covering.

An exploded view of the ISPBS 400 is illustrated in FIGS. 10a to 10c. The embodiment of FIGS. 9a and 9b comprised of pressed wood fibers is not illustrated, yet may be comprised of a similar structure when disassembled. The assembled view, illustrated in FIG. 10a, corresponds to the side view 8b. The top protective component 401 may be comprised of vinyl with the first mounting support connectors 427 mounted on one end and the second mounting support connectors 428 mounted on an opposite end, such that the first connector 427 may snap into the second connector 428 when mounted overlapping, to create a waterproof and insulated environment for the wiring interconnections. Similarly the embodiment of FIGS. 9a and 9b, with pressed wood, may be interlocked by placing the metal or plastic tab 40 on top of the mounting end 39 in successive ISPBS 500.

FIG. 10c illustrates an expanded perspective view of the ISPBS 500. FIG. 10c illustrates the transparent portion 404 adhered to the vinyl of the top protection component 401 with a surface design 405, e.g. siding or bricks, visible when viewed from the top, applied to each. The middle solar array component 437 may be comprised of similar materials as previously described, and may include the positive lead 411 and the negative lead 406 connecting to a solar array 417 embedded within the middle solar array component 437. This middle solar array component 437, and lead wires 411 and 406 may be comprised of materials as previously described, yet may be configured so as to compliment this design. The bottom support component 407 is adhered together with the successive components 401 and 437, and to the mounting connectors 427 and 428 to form the assembled ISPBS 400.

Figure 11A:
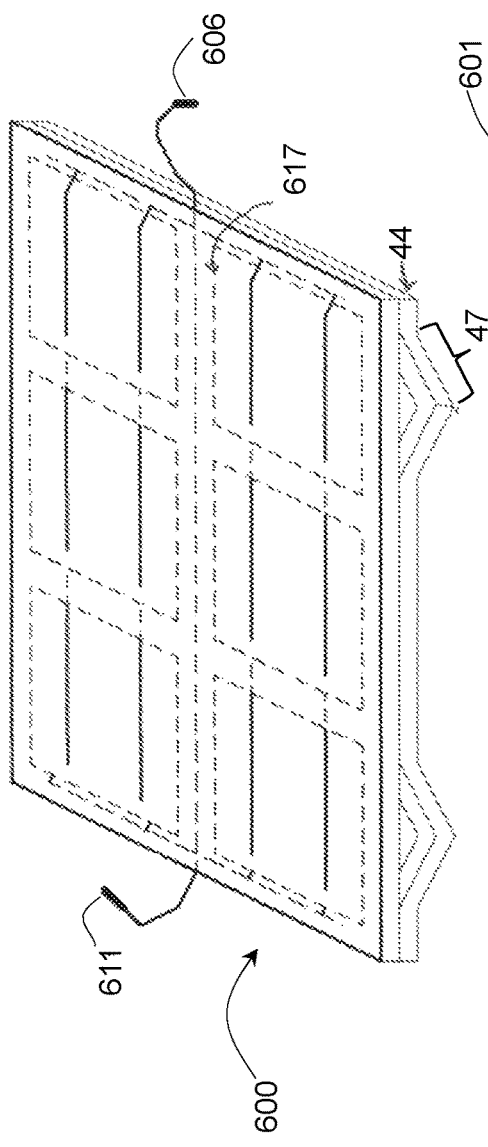
FIG. 11a is a top view of another embodiment of the present invention.
Figure 11B:
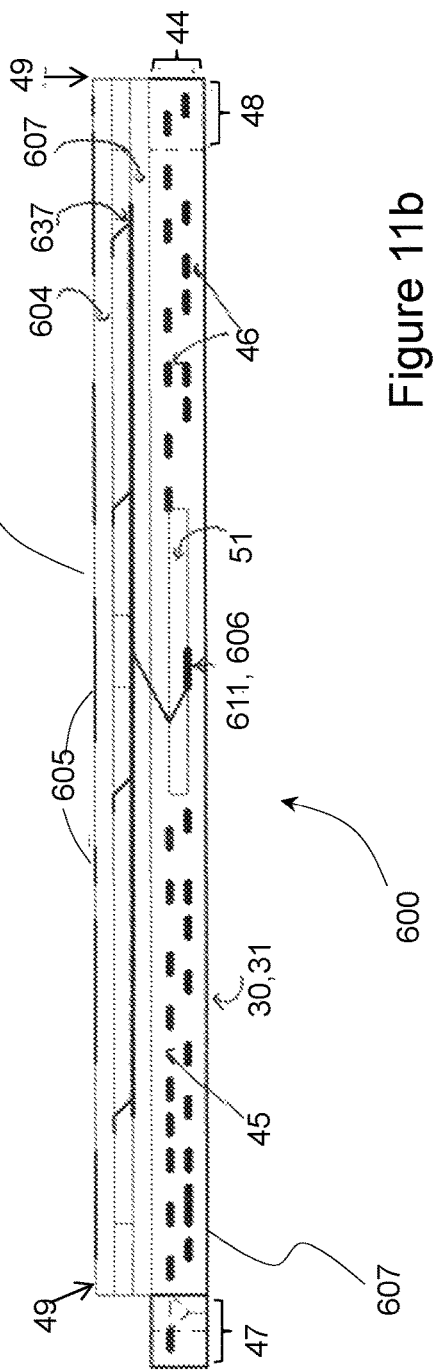

With reference to FIGS. 11a and 11b, an ISPBS 600 may be comprised of materials that are similar to those previously described yet may also be comprised of additional materials to expand the device application. The edge view of FIG. 11b illustrates a top protective component 601 comprised almost entirely of a transparent portion 604, a middle solar array component 637 and a bottom support component 607. These three components may be comprised of similar materials as described by liked named elements in the previous embodiments. Within the angled view of FIG. 11a the solar array 617, as illustrated by dotted lines, is embedded within the middle solar array component that is sealed between the transparent portion 604 and bottom support component 607. The solar array 617 may be configured with solar cells 20 of varying size as may compliment the patterned design 605 that may be comprised as previously described on the top surface to resemble a typical building material, e.g. roofing tile, brick or siding. The bottom support component 607 may be attached to a backing material 44, which may be comprised of cement 45 and filler 46. The filler 46 may be comprised of polystyrene beads or similar lightweight materials. As the bottom support component 607 may be comprised of woven fabric the cement 45 within the backing material 44 permeates into the woven fabric to bind these components together. The backing material 44 is shaped such that there are mounting connectors 47, e.g. fingers or tabs, and corresponding mounting connectors 48, e.g. opening or recesses. The backing material 44 may include an adhesive 30 with a removable plastic sheet 31 on the bottom surface thereof facilitating the mounting of the ISPBS 600 on a vertical of angled surface. A sealing ring 49, which may be comprised of a compressible rubber or urethane strip, may be provided for surrounding the edges of the ISPBS 600 and covering the edges of the transparent portion 604, the middle solar array component 637 and the bottom support component 607. The backing material 44 may also include connector recess 51, out of which the leads 611 and 606 may be configured to extend. The interlocking mounting connectors 47 and 48, the adhesive 30 and the sealing ring 49 enable the devices to be mounted adjacently or stacked, FIG. 12d, to form a sealed grid that may be electrically insulated and securely fastened to a vertical or angled surface.

With reference to FIGS. 12a to 12d, the ISPBS devices 100 to 600 may be interconnected into a grid. FIG. 12a illustrates overlapping ISPBS 100, in the form of roofing tiles or shingles, FIG. 12b illustrates interlocking ISPBS 200 or 300, FIG. 12c illustrates overlapping and interlocking ISPBS 400 or 500, and FIG. 12d illustrates stacked and interlocking configurations of ISPBS 600.

The ISPBS 100 may form a design that may comprise an overlapping grid (FIG. 12a) which may be comprised of one layer placed partially over the next in a manner where the transparent portion 4 covers the mounting portion 3 of the device beneath it. The placement may be comprised of a partial offset of one half the width of the tab portion 2 of each ISPBS 100 to produce a sealed, waterproof and electrically insulated protective surface under which the electrical system and structure may be protected. The grid may be comprised of interconnected devices in vertical rows where the leads 11 and 6 of each ISPBS 100 are interconnected to the one above it. The leads 11 and 6 extending from the lower and top rows of the grid may be comprised of an interconnection to grid bus wiring 21 in a parallel manner. The ISPBS 200 or 300 may also form a design that may comprise an interlocking grid (FIG. 12b) which may be comprised of adjacently placed devices in which a portion extending from one end of the ISPBS 200 or 300 fits in between two spaced apart portions on one end of an adjacent ISPBS 200 or 200, so as to produce a sealed, waterproof and electrically insulated protective surface under which the electrical system and structure may be protected. The grid may be comprised of interconnected devices in horizontal rows where the leads 211 and 206 of each ISPBS 200 or 300 are interconnected to an adjacent ISPBS 200 or 300. The leads 211 and 206 extending from the ISPBS 200 or 300 on the edges of the grid may be comprised of an interconnection to grid bus wiring 21 in a parallel manner. The ISPBS 400 or 500 may also form a design that may comprise an overlapping, offset and interlocking grid (FIG. 12c) which may be comprised of adjacently placed devices where the lower portion of one device is fit to the upper portion of the adjacent device in a fitted and overlapping manner that is offset a portion of the width so as to produce a sealed, waterproof and electrically insulated protective surface under which the electrical system and structure may be protected. The grid may be comprised of interconnected ISPBS 400 or 500 in horizontal rows, in which the leads 411 and 406 of each device are interconnected to an adjacent ISPBS 400 or 500. The leads 411 and 406 extending from the edges of the grid may be comprised of an interconnection to grid bus wiring 21 in a parallel manner. The ISPBS 600 may also form a design that may comprise an adjacent grid (FIG. 12d) which may be comprised of adjacently placed ISPBS 600 in which the ISPBS 600 are aligned such that the length of one edge of the ISPBS 600 is aligned to a corresponding edge of the adjacent ISPBS 600 to produce a sealed, waterproof and electrically insulated protective surface under which the electrical system and structure may be protected. The grid may be comprised of interconnected ISPBS 600 in horizontal rows where the leads 611 and 606 of each ISPBS 600 are interconnected to an adjacent ISPBS 600. The leads 611 and 606 extending from the edges of the grid may be comprised of an interconnection to grid bus wiring 21 in a parallel manner. The grid bus wiring 21 may be comprised of electrical wiring and may be interconnected to the structure electrical system. Each grid (FIGS. 12a to 12d) may be comprised of alternate ISPBS devices, e.g. 56, so as to completely cover the surface area for a particular application.

Figure 13:
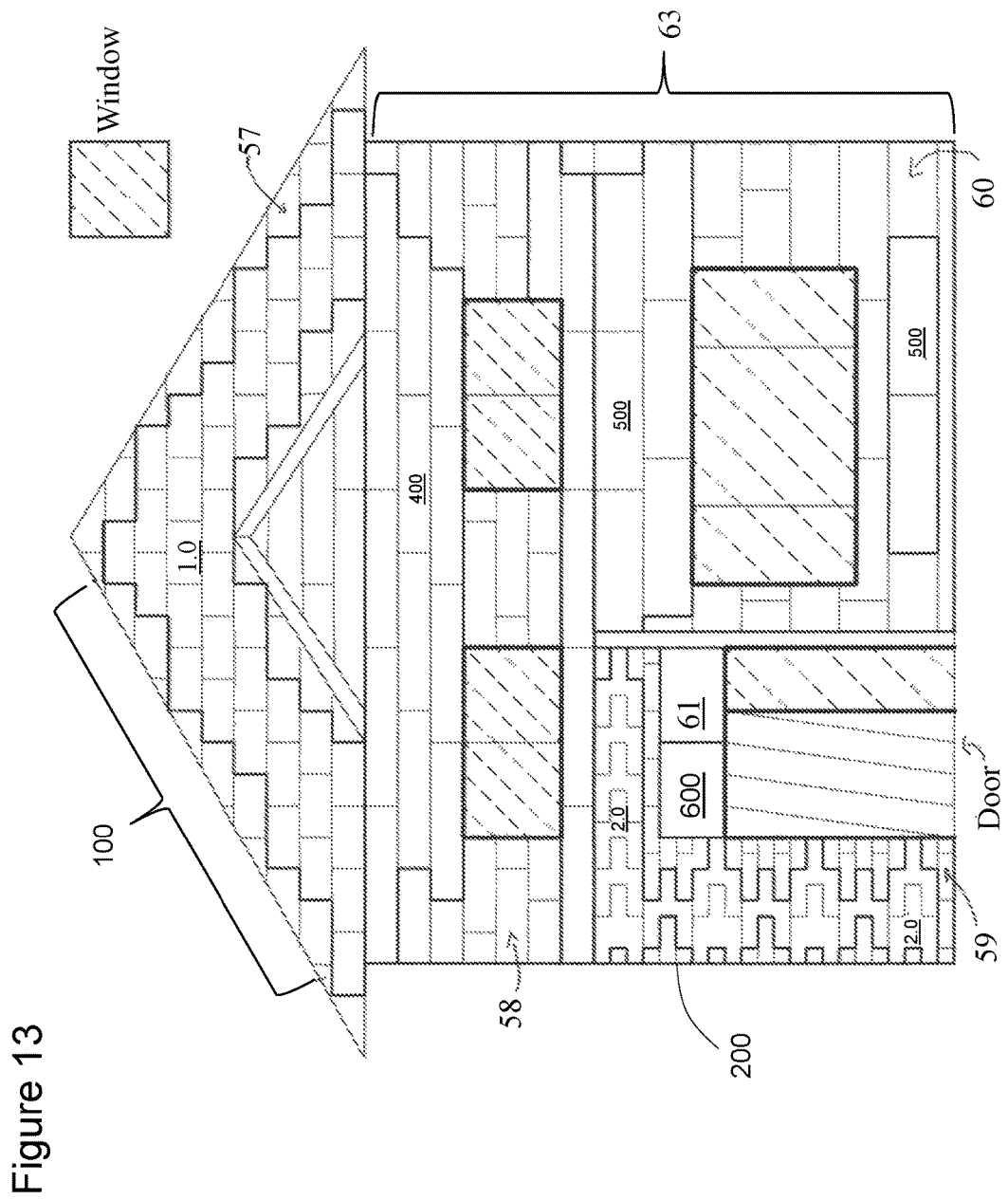
FIG. 13 illustrates a building with the structures of FIGS. 1 to 10 thereon.

With reference to FIG. 13, the placement of ISPBS devices may comprise a grid of varying dimension. The grid may comprise ISPBS devices of varying configurations to cover the surface area for an installation or they may be combined with other building materials, such as shingles 57, bricks 58, concrete 59, siding 60 or wood 61, to complete an installation design. The ISPBS grid may be comprised of an SBPP devices to cover a portion (62) or the whole of the surface area (63) of any dimension.

Mechanical Property Description

The device has mechanical properties that are imparted upon the composite when combined according to the description above and in accordance with the figures. The mechanical properties relate to each of the seven components of the composite as follows:

The bottom supporting component, i.e. 7 to 607, may be comprised of a woven fabric or polymer foam with a thickness that may vary, yet normally 0.8 to 1.2 mm, such that it may be compressible by up to 80% of its initial volume without permanent deformation. This compression resilience may typically be in the range of 8.5 to 20 g/cm² as determined by:

$CR = T/W$ Where: $CR = g/cm^2$, $T$=material thickness (cm), and $W = g/cm^3$

When bounded by adhesive the characteristic of Elasticity, or spring like compression resilience, is achieved according to Hooke's Law according to the ideal gas law (PV=nRT) such that a backpressure of up to 3200 MPa may be realized at 79.7% of the compressed volume and a stroke length of 0.797 mm for every 1.0 mm of thickness.

The adhesive layer, i.e. 12 and 22, may compress according to the bulk modulus elasticity of each of the components. The urethane based polymer epoxy resins have a bulk modulus of 2.3 Pa ($N/m^2$) and the aliphatic component is 1.5 Pa ($N/m^2$). The adhesive may be comprised of 95:5 to 85:15 urethane to aliphatic component achieving from 2.18 to 2.26 Pa which is a function of their relative proportions as per:

$$BM=BM1*\%1+BM2*\%2:$$

Where: BM=Bulk modulus of Adhesive; BM1=Bulk modulus of material 1, with %1=% of material 1 in composition; BM2=Bulk modulus of material 2, with %2=% of material 2 in composition The pressed fibers in the vibration dampening/shock-absorbing layer 16 and the support layer 18, in each of the ISPBS 100-600 have a tensile strength that may vary according to thickness and density of the material. The material are comprised in thicknesses that may vary but typically from 0.5 to 1.5 mm and density (or weight) of approximately 40 kg/$m^2$. The fibers in the material are comprised from organic sources with a tensile strength of up to 100 kg/m. When combined with the adhesive 12 or 22, the woven fiber layers 16 and 18 may realize a stiffness of up to 100 N/m.

The top protective component, e.g. 1, 201 ... 601, in particular the transparent portion, e.g. 4, 204 ... 604, may be a polymer of varying compositions with varying thicknesses, typically 1.6 to 3.0 mm, and are comprised in a manner to achieve an elastic or tensile modulus of between 2400 and 3500 Mpa. In the composite configuration this layer may resist a strike force of up to 14.2 N, by deflecting up to 96% of the spacing between layers 4 and 20 in FIG. 1, according to:

$$F(f)=m(f)a$$

Where: F(f)=Force realized (N); m(f)=Fractional mass by area (kg/$cm^3$); and a=acceleration (m/$s^2$)

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A shock absorbing and vibration damping construction panel comprising:
    a bottom support component;
    at least one solar cell assembly supported by the bottom support component;
    a vibration damping component surrounding each solar cell assembly comprising a material with a Young's modulus of less than 5 GPA;
    a top transparent protective component mounted on the vibration damping layer with a gap from each solar cell assembly for protecting each solar cell assembly, and transferring any impact forces to the vibration damping layer isolated from the solar cells; and
    electrodes for electrically connecting each solar cell to adjacent panels;
    wherein, in response to a force applied to the top protective component, the top protective component is deformable up to the width of the gap, and the vibration damping component transfers the force to the bottom support component.

2. The construction panel according to claim 1, wherein the gap between the top transparent protective component and each solar cell assembly ranges from 0.8 mm to 1.6 mm.

3. The construction panel according to claim 1, wherein the vibration damping component comprises a material with a Young's modulus between 2.4 and 3.5 GPa.

4. The construction panel according to claim 1, wherein the vibration damping component comprises pressed fiber materials.

5. The construction panel according to claim 4, wherein the vibration damping component comprises a felt or needled felt with a tensile strength of up to 100 kg/m.

6. The construction panel according to claim 4, wherein the vibration damping component comprises:
    a cut-out layer with openings for receiving each solar cell assembly;
    a support layer beneath each solar cell assembly for supporting each solar cell assembly; and
    an adhesive layer between the cut-out layer and the support layer, and between the support layer and each solar assembly.

7. The construction panel according to claim 6, wherein an adsorptive capacity for adhesive in the adhesive layer to penetrate the pressed fiber material is up to 10% of the thickness of the vibration damping component or up to 5% of the pressed fiber volume; and wherein in a combined state the vibration damping component results in a stiffness of up to 100 N/m.

8. The construction panel according to claim 6, wherein each solar cell assembly includes wiring extending from solar cells to electrodes; and wherein the wiring is insulated and supported in the adhesive layer.

9. The construction panel according to claim 6, wherein the adhesive layer is comprised of two main components, such that the adhesive is able to achieve a range in bulk modulus of elasticity in the range of 2.18 to 2.26 Pa;
    wherein when in a combined state; the adhesive layer ranges in thickness between 0.1 to 0.3 mm, so as to impart a range of torsion strength; and
    wherein the adhesive layer is sufficiently polymerized to attain a shear modulus of up to 15.6 N/$m^2$.

10. The construction panel according to claim 4, wherein the vibration damping component includes a water proof material absorbed into the pressed fiber material.

11. The construction panel according to claim 1, wherein the bottom support component comprises a woven fabric material, said woven fabric material is comprised of a material, or woven with sufficient density, to result in a strength or resilience, of up to 20 g/$cm^2$ before compression.

12. The construction panel according to claim 1, wherein the top transparent protective component comprises a material with an Elastic Modulus of up to 3200 MPa for a 3.5 mm thickness; and able to withstand a 100 N strike force without shattering.

13. The construction panel according to claim 1, wherein the top transparent protective component comprises a polymer material at least partially transparent to sunlight.

14. The construction panel according to claim 1, wherein the top transparent protective component comprises a polymer material that imparts coloring, patterning or texture of a standard building material selected from the group consisting of shingle, brick, and siding.

15. The construction panel according to claim 1, further comprising an adhesive backing for adherence to another building material.

16. The construction panel according to claim 1, further comprising a first connector on a first end of the panel, and second connector on a second end of the panel for interconnecting adjacent panels.

* * * * *